(12) United States Patent
Behjati Najafabadi

(10) Patent No.: US 12,726,146 B2
(45) Date of Patent: Sep. 1, 2026

(54) PARAMETER ESTIMATION FOR A PERMANENT MAGNET SYNCHRONOUS MOTOR

(71) Applicant: Infineon Technologies Austria AG, Villach (AT)

(72) Inventor: Hamid Behjati Najafabadi, Los Angeles, CA (US)

(73) Assignee: Infineon Technologies Austria AG, Villach (AT)

( * ) Notice: Subject to any disclaimer, the term of this patent is extended or adjusted under 35 U.S.C. 154(b) by 244 days.

(21) Appl. No.: 18/611,856

(22) Filed: Mar. 21, 2024

(65) Prior Publication Data

US 2025/0300584 A1 Sep. 25, 2025

(51) Int. Cl.
*H02P 23/14* (2006.01)
*G01R 31/34* (2020.01)
*H02P 25/022* (2016.01)

(52) U.S. Cl.
CPC .............. *H02P 23/14* (2013.01); *G01R 31/34* (2013.01); *H02P 25/022* (2013.01)

(58) Field of Classification Search
CPC ........ H02P 23/14; H02P 25/022; H02P 21/14; H02P 21/141; G01R 31/34
USPC .................................................. 318/700, 558
See application file for complete search history.

(56) References Cited

U.S. PATENT DOCUMENTS 7,339,344 B2 3/2008 Borisavljevic
8,228,013 B2 7/2012 Liu et al.
9,143,068 B2 * 9/2015 Lin ......................... H02P 6/183
9,515,596 B2 * 12/2016 Deguchi ............... H02P 25/092
9,692,339 B2 6/2017 Rogg et al.
10,833,613 B2 * 11/2020 Shigeta ................... H02P 21/18
11,689,142 B2 * 6/2023 White ..................... H02P 21/22 318/445
2013/0093370 A1 4/2013 Yoo

FOREIGN PATENT DOCUMENTS

EP 1758239 A2 2/2007
EP 2421146 B1 2/2015

OTHER PUBLICATIONS

"InstaSPIN-FOC™ and InstaSPIN-MOTION™ User's Guide", Texas Instruments, Literature No. SPRUHJ11, Jan. 2013, pp. 1-591.
"STM32 MC Motor Profiler", Wiki by ST, Apr. 11, 2022.

* cited by examiner

*Primary Examiner* — David Luo
(74) *Attorney, Agent, or Firm* — Murphy, Bilak & Homiller, PLLC

(57) ABSTRACT

A method of parameter estimation for a PMSM (permanent magnet synchronous motor) includes: iteratively revising an estimate of an inductance parameter of the PMSM, until the estimate either converges to a predetermined accuracy level or diverges; and controlling a magnitude of phase currents injected into the PMSM during each iteration of revising the estimate of the inductance parameter. Additional methods of PMSM parameter estimation are described, including rotor flux linkage estimation.

17 Claims, 7 Drawing Sheets

PARAMETER ESTIMATION FOR A PERMANENT MAGNET SYNCHRONOUS MOTOR

BACKGROUND

FOC (field oriented control) is highly desired in motor control applications because of advantageous characteristics such as improved performance, especially for PMSM (permanent magnet synchronous motor) applications. PMSM applications include two motor types: SPM (surface permanent magnet) and IPM (interior permanent magnet) motors. Accurate estimation of PMSM parameters is required to tune various controllers such as the current controller, torque controller, flux controller, speed controller, etc. The main motor parameters that need to be extracted include: the stator resistance r, the stator q-axis inductance $L_q$, the stator d-axis inductance $L_d$, and the rotor permanent-magnet flux linkage $\lambda_m$. For IPMs, the stator q-axis inductance $L_q$ is not the same as the stator d-axis inductance $L_d$ due to the motor construction and placement of the permanent magnets inside the rotor.

Some conventional PMSM parameter estimation techniques do not independently extract the stator q-axis inductance $L_q$ and the stator d-axis inductance $L_d$. Other conventional PMSM parameter estimation techniques simply inject a few excitation voltages with different frequencies and measure the current responses, taking the average of the calculated inductances in the end. However, there is no control over the current magnitude which can lead to either overloading of the motor/saturation or applying too little current that would result in a very low signal-to-noise ratio in the current measurements. Saturation can also change the stator inductances. In each case, conventional PMSM parameter estimation techniques suffer from poor accuracy.

Thus, there is a need for an improved PMSM parameter estimation methodology.

SUMMARY

According to an embodiment of a method of parameter estimation for a PMSM (permanent magnet synchronous motor), the method comprises: iteratively revising an estimate of an inductance parameter of the PMSM, until the estimate either converges to a predetermined accuracy level or diverges; and controlling a magnitude of phase currents injected into the PMSM during each iteration of revising the estimate of the inductance parameter.

According to another embodiment of a method of parameter estimation for a PMSM, the method comprises: estimating of an inductance of the PMSM along a first axis aligned with a permanent magnet flux of the PMSM; estimating an inductance of the PMSM along a second axis perpendicular to the permanent magnet flux of the PMSM; and estimating rotor flux linkage of the PMSM based on a magnitude component of a phase-lock-loop (PLL) used to implement rotor-frame-orientation (RFO) field oriented control (FOC) of the PMSM, and a difference between the inductance estimated along the first axis and the inductance estimated along the second axis.

According to another embodiment of a method of parameter estimation for a PMSM, the method comprises: estimating of an inductance of the PMSM along an axis aligned with a permanent magnet flux of the PMSM; and estimating rotor flux linkage of the PMSM based on a magnitude component of a phase-lock-loop (PLL) used to implement stator-frame-orientation (SFO) field oriented control (FOC) of the PMSM, the inductance estimated along the axis aligned with the permanent magnet flux of the PMSM, and a load angle estimate in SFO.

According to an embodiment of a computer program product comprising one or more non-transitory computer readable media storing a computer program operable, when executed by a controller, to direct the controller to execute a method of parameter estimation for a PMSM (permanent magnet synchronous motor), the computer program comprises: program instructions to iteratively revise an estimate of an inductance parameter of the PMSM, until the estimate either converges to a predetermined accuracy level or diverges; and program instructions to control a magnitude of phase currents injected into the PMSM during each iteration of revising the estimate of the inductance parameter.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
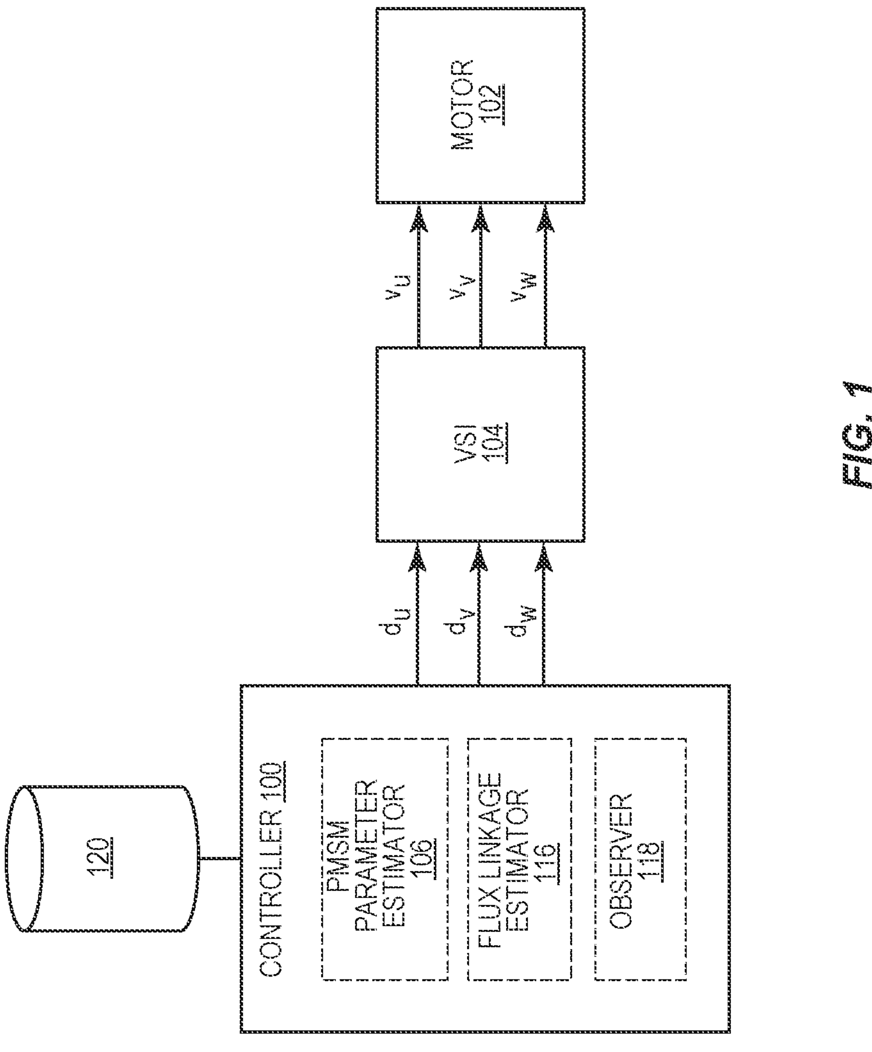
FIG. 1 illustrates a schematic diagram of an adaptive motor controller that implements an iterative parameter estimation process and flux linkage estimation process.

Described herein are embodiments of an iterative PMSM (permanent magnet synchronous motor) parameter estimation methodology that converges on the real values of the inductance parameters ($L_q$ and $L_d$) of a PMSM while simultaneously controlling the current magnitude such that the obtained current magnitude converges to a current magnitude command (target) input to the system. The iterative PMSM parameter estimation methodology provides self-correction at each iteration step. At each iteration, the estimated values are updated based on the best possible solution (e.g., least-squares method) of all previous results and the control variables for next step are adjusted accordingly. As opposed to conventional methods which provide only a single final result (usually the average), a convergence in the estimated values is observable with the methodology described herein, which indicates that final result is reliable. Convergence means a solution is reached within a finite number of iterations. A divergence of the sequence indicates that the final results are not reliable and should be discarded.

The iterative PMSM parameter estimation methodology also provides higher accuracy. Because of the self-correction that occurs each step, convergence is achieved quickly within the first few iteration steps. Therefore, higher accuracy can be obtained without excessively increasing the number of test points.

By simultaneously controlling the current magnitude at each iteration step, the current magnitude will not drop significantly with increasing frequency (while applying constant voltage magnitude). Accordingly, accuracy and precision are maintained when measuring the current magnitude. Shunt resistors are typically sized for the peak current rating of the motor, yielding full-scale ADC (analog-to-digital converter) voltage at the peak current of the motor plus margin to allow for over current detection. For measuring the inductance parameters ($L_q$ and $L_d$) of a PMSM, the injected dc and ac currents must be much lower than the peak current rating of the motor; Otherwise, the measurements would not be accurate due to saturation of the inductances along both axes ($L_q$ and $L_d$). For example, the injected currents are typically limited to no more than 5%~10% above the peak current rating of the motor. This means that the ADC voltages would be already at a level below 5%~10% of the full-scale ADC voltage. The ADC of a digital controller has limited precision even at full-scale voltage, e.g., 12 bits per full-scale voltage covering both positive and negative current values. This means at 5% of the full-scale voltage, an ADC reading of 0.05×(212/2×0.7) =71 ticks results, where the division by 2 is because of positive/negative current coverage and 0.7 represents the margin for over-current detection. Thus, the ADC precision and signal-to-noise-ratio are very limited at 5% of peak current rating of the motor.

If the applied voltage results in 5% of the peak current rating of the motor at low frequencies where the effect of ωL on Z is minimal (where w is electrical frequency and Z is impedance), then the resulting current at higher frequencies where the effect of ωL on Z becomes significant enough to estimate L becomes too small and well below the current measurement capabilities of the ADC. For example, at one decade above the corner frequency of the motor (r/L), the ADC reading would be ~0.1×71 ticks=7 ticks, which will result in inadequate precision and poor signal to noise ratio. For these reasons, simultaneously controlling the current magnitude at each iteration step (e.g. at 5% to 10% of the peak current rating of the motor) of updating the inductance estimate ensures accuracy and precision are maintained when measuring the current magnitude.

Described next, with reference to the figures, are exemplary embodiments of the iterative PMSM parameter estimation methodology.

FIG. 1 illustrates a block diagram of a controller 100 for a PMSM 102. The controller 100 generates a command duty cycle 'd' for each phase of the PMSM 102. In FIG. 1, the PMSM 102 is depicted as having three phases: u, v, and w. More generally, the PMSM 102 can have two of more phases. A voltage source inverter (VSI) 104 translates each phase command generated by the controller 100 into a corresponding motor phase voltage $v_n$.

The controller 100 includes a PMSM parameter estimator 106. The PMSM parameter estimator 106 implements an iterative PMSM parameter estimation methodology that converges on the real values of the stator q-axis inductance $L_q$ and the stator d-axis inductance $L_d$ of the PMSM 102, while simultaneously controlling the current magnitude such that the obtained current magnitude converges to the current magnitude command (target) input to the system. Before describing the PMSM parameter estimator 106 in more detail, some mathematical conventions are explained next.

For IPM motors, the inductance of the q-axis ($L_q$) is not the same as the inductance of the d-axis ($L_d$) due to the construction of motor and placement of the permanent magnets inside the rotor. Without loss of generality, different notations are used herein for $L_q$ and $L_d$ here to cover IPMs. For SPM motors, $L_q$=$L_d$=L can be assumed.

The stator voltages of the PMSM 102, whether IPM or SPM, can be expressed by the following algebraic-differential equations:

$$\begin{cases} v_{qd}^{\hat{\theta}} = r i_{qd}^{\hat{\theta}} + \dfrac{d\lambda_{qd}^{\hat{\theta}}}{dt} + \hat{\omega}\begin{bmatrix} \lambda_d^{\hat{\theta}} \\ -\lambda_q^{\hat{\theta}} \end{bmatrix} + \omega\lambda_m \begin{bmatrix} \cos(\tilde{\theta}) \\ -\sin(\tilde{\theta}) \end{bmatrix}, \\ \lambda_{qd}^{\hat{\theta}} = \left( L_0 I + L_1 C R(2\tilde{\theta}) \right) i_{qd}^{\hat{\theta}} \end{cases} \tag{1}$$

where $$x_{qd}^{\hat{\theta}}$$

denotes a vector of q- and d-axis variables in an arbitrary reference frame $\hat{\theta}$, $$x_{qd}^{\hat{\theta}} = \begin{bmatrix} x_q^{\hat{\theta}} \\ x_d^{\hat{\theta}} \end{bmatrix}, \tag{2}$$

where θ is the real angle of the rotor and $\tilde{\theta}$ is the difference between the real angle of the rotor and the chosen reference-frame angle $\hat{\theta}$:

$$\tilde{\theta} = \theta - \hat{\theta} \tag{3}$$

According to equation (1), the difference between the real angle θ of the rotor and the chosen reference frame angle $\tilde{\theta}$ determines the back-emf voltages, $\omega\lambda_m \cos(\tilde{\theta})$ and $\omega\lambda_m \sin(\tilde{\theta})$ in the chosen reference frame.

To simplify the equations, instead of $L_q$ and $L_d$, $L_0$ and $L_1$ are substituted in equation (1) as follows:

$$\begin{cases} L_q = L_0 + L_1 \\ L_d = L_0 - L_1 \end{cases} \leftrightarrow \begin{cases} L_0 = \dfrac{L_q + L_d}{2} \\ L_1 = \dfrac{L_q - L_d}{2} \end{cases} \tag{4}$$

The matrices I and C are respectively the identity and complex-conjugate matrices, and given as follows:

$$I = \begin{bmatrix} 1 & 0 \\ 0 & 1 \end{bmatrix}, C = \begin{bmatrix} 1 & 0 \\ 0 & -1 \end{bmatrix} \tag{5}$$

(6)

The rotation matrix $R(2\tilde{\theta})$, also known as Park Transform, is defined as follows:

$$R(2\tilde{\theta}) = \begin{bmatrix} \cos(2\tilde{\theta}) & -\sin(2\tilde{\theta}) \\ \sin(2\tilde{\theta}) & \cos(2\tilde{\theta}) \end{bmatrix} \tag{7}$$

Assuming that the chosen reference frame is the stationary reference frame ($\hat{\theta}=0$), which is also known as $\alpha\beta$ frame:

$$\alpha\beta \text{ stationary frame:} \begin{cases} \hat{\theta} = 0 \\ \hat{\omega} = 0 \end{cases} \tag{8}$$

Thus, equation (1) can be simplified to:

$$\begin{cases} v_{\alpha\beta} = ri_{\alpha\beta} + \dfrac{d\lambda_{\alpha\beta}}{dt} + \omega\lambda_m \begin{bmatrix} \cos(\theta) \\ -\sin(\theta) \end{bmatrix} \\ \lambda_{\alpha\beta} = (L_0 I + L_1 CR(2\theta))i_{\alpha\beta} \end{cases} \tag{9}$$

To extract the stator resistance r, the stator q-axis inductance $L_d$, the stator d-axis inductance $L_d$, and the rotor permanent-magnet flux linkage $\lambda_m$ parameters for the PMSM 102, the rotor of the PMSM 102 is locked at a certain angular position. The rotor can be locked by applying a large enough dc-current along the α axis and allowing enough time for the rotor to rotate and settle. Once the rotor is locked, the u-v-w, q-d, and α-β reference frames are as shown in FIG. 2.

Figure 2:
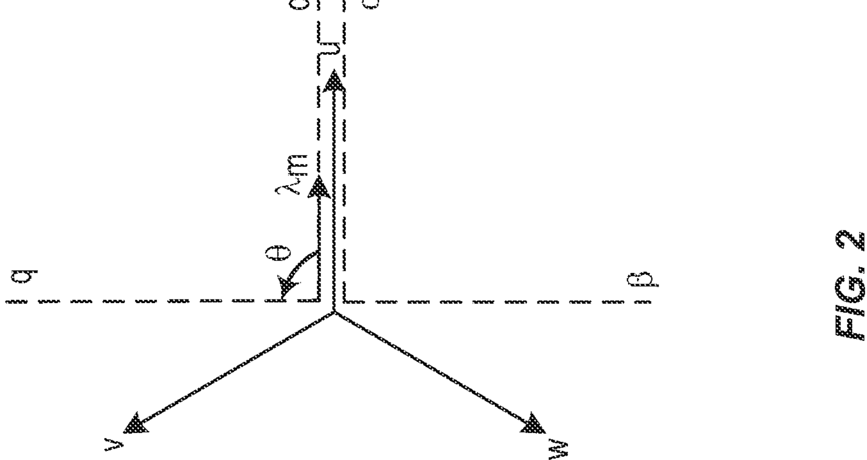
FIG. 2 illustrates vector representations of the u-v-w, q-d, and $\alpha$-$\beta$ reference frames of the motor when the rotor is locked.

As shown in FIG. 2, the rotor angle and rotor angular speed are as follows:

$$\begin{cases} \theta = \dfrac{\pi}{2} \\ \omega = 0 \end{cases} \tag{10}$$

By substituting $\theta=\pi/2$ and $\omega=0$ in equation (9), the following can be obtained:

$$\begin{cases} v_{\alpha\beta} = ri_{\alpha\beta} + \dfrac{d\lambda_{\alpha\beta}}{dt} \\ \lambda_{\alpha\beta} = (L_0 I + L_1 CR(2\theta))i_{\alpha\beta} \end{cases} \tag{11}$$

The stator flux linkages, $\lambda_{\alpha\beta}$, can thus be simplified as follows:

$$\lambda_{\alpha\beta} = \left(L_0\begin{bmatrix} 1 & 0 \\ 0 & 1 \end{bmatrix} + L_1\begin{bmatrix} 1 & 0 \\ 0 & -1 \end{bmatrix}\begin{bmatrix} -1 & 0 \\ 0 & -1 \end{bmatrix}\right) i_{\alpha\beta} = \begin{bmatrix} L_0 - L_1 & 0 \\ 0 & L_0 + L_1 \end{bmatrix} i_{\alpha\beta} = \begin{bmatrix} L_d & 0 \\ 0 & L_q \end{bmatrix} i_{\alpha\beta} \tag{12}$$

Equation (12) shows that once the rotor is locked, the inductance observed along the α axis is the d-axis inductance $L_d$ of the PMSM 102, whereas the inductance observed along the β axis is the q-axis inductance $L_q$ of the PMSM 102.

Accordingly, the voltage relationships expressed in equation (11) can be rewritten as follows:

$$\begin{cases} v_\alpha = ri_\alpha + \dfrac{di_\alpha}{dt} \\ v_\beta = ri_\beta + L_q\dfrac{di_\beta}{dt} \end{cases} \tag{13}$$

Equation (13) shows that once the rotor is locked, the inductance observed along the α axis is the d-axis inductance $L_d$ of the motor 102, whereas the inductance observed along the β axis is the q-axis inductance $L_q$ of the motor 102.

When the rotor of the PMSM 102 is locked and the dc-currents reach a steady-state value, the PMSM parameter estimator 106 can estimate the resistance r of the PMSM 102 using the applied dc voltage $V_\alpha$ and the commanded (target) dc current $I_\alpha^*$, as follows:

$$r = \frac{V_\alpha}{I_\alpha} = \frac{V_\alpha}{I_\alpha^*} \tag{14}$$

Injecting some high-frequency components into the αβ-axes, in addition to the dc component applied to α-axis, yields the following:

$$\begin{cases} i_\alpha = I_\alpha + \hat{\imath}_\alpha \\ i_\beta = 0 + \hat{\imath}_\beta \end{cases} \tag{15}$$

Substituting the high-frequency current magnitudes $i_\alpha$ and $i_\beta$ from equation (15) into equation (13) yields the following:

$$\begin{cases} V_\alpha + \hat{v}_\alpha = rI_\alpha + r\hat{\imath}_\alpha + L_d\dfrac{d\hat{\imath}_\alpha}{dt} \\ \hat{v}_\beta = r\hat{\imath}_\beta + L_q\dfrac{d\hat{\imath}_\beta}{dt} \end{cases} \tag{16}$$

If the injected high-frequency voltages constitute a counter-clock-wise rotating vector with an angular frequency $\omega_h$, the voltage relationships can be represented by:

$$\hat{v}_{\alpha\beta} = \begin{bmatrix} |\hat{v}_\alpha|\cos(\omega_h t) \\ -|\hat{v}_\beta|\sin(\omega_h t) \end{bmatrix}, \tag{17}$$

and the resulting high-frequency current magnitudes become:

$$\begin{cases} |\hat{\imath}_\alpha|^2 = \dfrac{|\hat{v}_\alpha|^2}{r^2 + (L_d\omega_h)^2} \\ |\hat{\imath}_\beta|^2 = \dfrac{|\hat{v}_\beta|^2}{r^2 + (L_q\omega_h)^2} \end{cases} \tag{18}$$

In practice, the high-frequency voltage is injected into the α-axis and its corresponding current is measured, and then the high-frequency current is injected into the β-axis and its corresponding current is measured, as follows:

$$\begin{cases} \hat{v}_\alpha = |\hat{v}_\alpha|\cos(\omega_h t) \\ \hat{v}_\beta = 0 \end{cases} \Rightarrow \begin{cases} |\hat{\imath}_\alpha|^2 = \dfrac{|\hat{v}_\alpha|^2}{r^2 + (L_d\omega_h)^2} \Rightarrow L_d = ? \\ |\hat{\imath}_\beta|^2 = 0 \end{cases} \tag{19}$$

-continued $$\begin{cases} \hat{v}_\alpha = 0 \\ \hat{v}_\beta = -|\hat{v}_\beta|\sin(\omega_h t) \end{cases} \Rightarrow \begin{cases} |\hat{\imath}_\alpha|^2 = 0 \\ |\hat{\imath}_\beta|^2 = \frac{|\hat{v}_\beta|^2}{r^2 + (L_q\omega_h)^2} \end{cases} \Rightarrow L_q = ? \tag{20}$$

As can be seen in equations (19) and (20), the PMSM parameter estimator 106 can estimate $L_d$ and $L_d$ by processing the measured current magnitudes, $|\hat{\imath}_\alpha|$ and $|\hat{\imath}_\beta|$.

Figure 3:
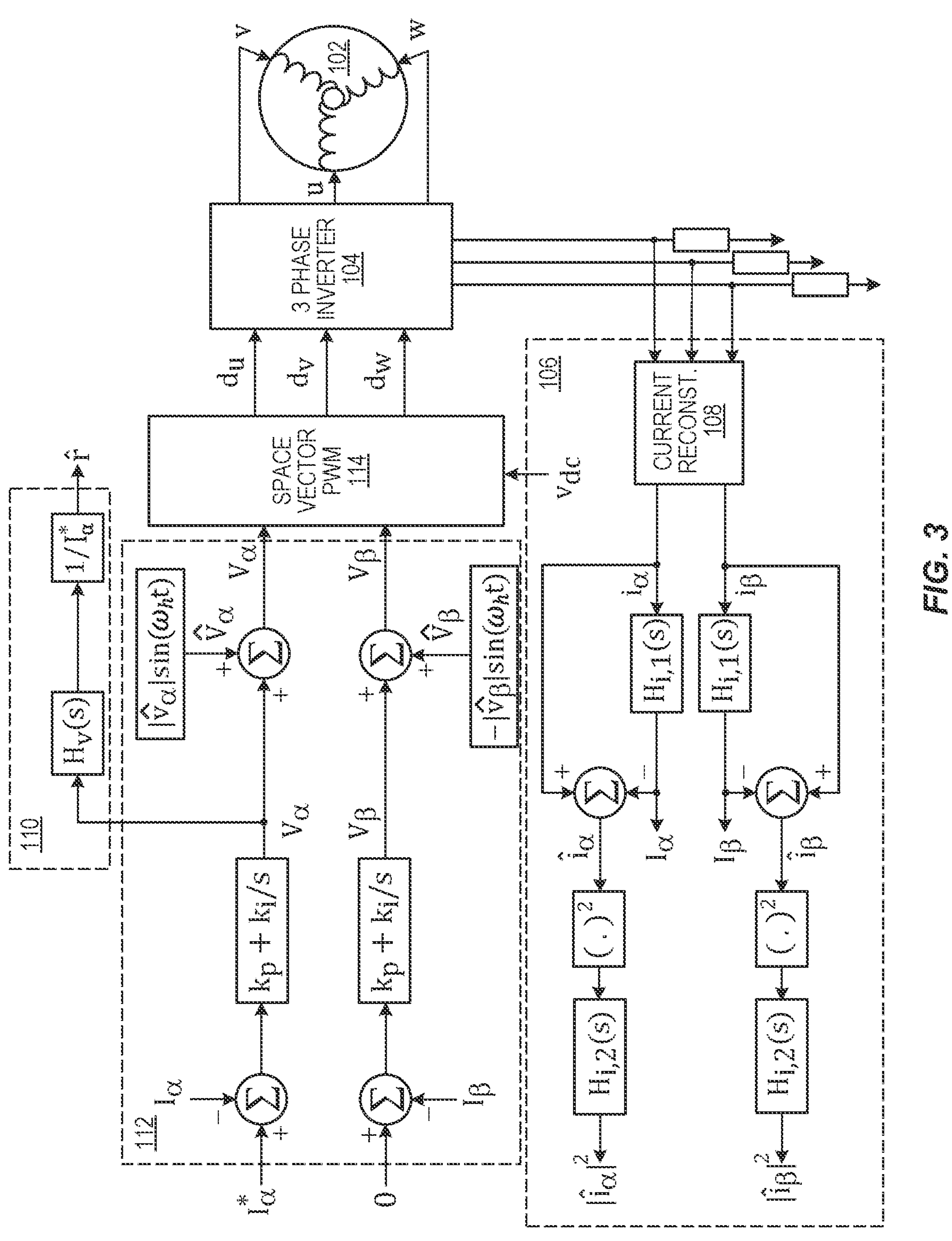
FIG. 3 illustrates a block diagram of an embodiment of the motor system.

FIG. 3 illustrates a block diagram of an embodiment of the motor system, including dc current regulators 106 with current reconstruction 108, a resistance estimator 110, ac voltage/current injection components and extractors 112, and PWM (pulse width modulation) block 114 such as a space vector PWM generating the phase commands $d_u$, $d_v$, $d_w$ provided to the voltage source inverter 104.

Without loss of generality, equations (19) and (20) can be expressed in general terms as follows:

$$|\hat{\imath}|^2 = \frac{|\hat{v}|^2}{r^2 + (L\omega)^2} \tag{21}$$

where $\{[\hat{\imath}], [\hat{v}], \text{and } L\}$ are either $\{[\hat{\imath}_\alpha], [\hat{v}_\alpha], \text{and } L_d\}$ or $\{[\hat{\imath}_\beta], [\hat{v}_\beta], \text{and } L_q\}$ respectively, and $\omega$ is $\omega_h$.

To increase the estimation accuracy, the PMSM parameter estimator 106 can use multiple injection frequencies to estimate L (i.e., $L_d$ or $L_d$). At each frequency point $\omega_k$, the injected high-frequency voltage $|\hat{v}|_k$ results in a measured high-frequency current $|\hat{\imath}|_k$. Then, the PMSM parameter estimator 106 can obtain the best estimation of L at that particular frequency as follows:

$$|\hat{z}|_k^2 = \frac{|\hat{v}|_k^2}{|\hat{\imath}|_k^2} = r^2 + \omega_k^2 L^2 \Rightarrow \omega_k^2 L^2 |\hat{z}|_k^2 - r^2 \tag{22}$$

$$k = 1, \ldots, n$$

All of the measurement results can be collected in vector format as follows:

$$\underbrace{\begin{bmatrix} \omega_1^2 \\ \vdots \\ \omega_n^2 \end{bmatrix}}_{A_{n\times 1}} \underline{L^2}_{x_{1\times 1}} = \underbrace{\begin{bmatrix} |\hat{z}|_1^2 - r^2 \\ \vdots \\ |\hat{z}|_n^2 - r^2 \end{bmatrix}}_{b_{n\times 1}} \tag{23}$$

$$A_{n\times 1} x_{1\times 1} = b_{n\times 1} \tag{24}$$

As can be seen in equations (23) and (24), there are n equations and one variable to solve for, i.e. $L^2$. The PMSM parameter estimator 106 can provide the best approximate solution using the least-squares method, by multiplying both sides of equation (23) and (24) with $$A_{1\times n}^T$$

as follows:

$$A_{1\times n}^2 A_{n\times 1} x_{1\times 1} = A_{1\times n}^T b_{n\times 1} \tag{25}$$

In other words, $$\begin{bmatrix} \omega_1^2 & \ldots & \omega_n^2 \end{bmatrix} \begin{bmatrix} \omega_1^2 \\ \vdots \\ \omega_n^2 \end{bmatrix} L^2 = \begin{bmatrix} \omega_1^2 & \ldots & \omega_n^2 \end{bmatrix} \begin{bmatrix} |\hat{z}|_1^2 - r^2 \\ \vdots \\ |\hat{z}|_n^2 - r^2 \end{bmatrix}. \tag{26}$$

Every time a new $|\hat{v}|n$ is applied and consequently a new $|\hat{\imath}|_n$ is measured, the PMSM parameter estimator 106 can calculate the resulting $|\hat{z}|_n$ based on equation (22) and update the L estimation ($L_n$). The following equation summarizes this process implemented by the PMSM parameter estimator 106 based on equation (26):

$$L_n^2 = \frac{a_n}{b_n} \text{ where:} \tag{27}$$

$$\begin{cases} a_n = \sum_{k=1}^{n} \left(|\hat{z}|_k^2 - r^2\right)\omega_k^2 \\ b_n = \sum_{k=1}^{n} \omega_k^4 \end{cases} \tag{28}$$

The PMSM parameter estimator 106 implements an iterative method to update the best approximation of L at every iteration n, while controlling the magnitude $|\hat{\imath}|_n$ of the phase currents injected into the PMSM 102 at a constant level $|\hat{\imath}|^*$. The PMSM parameter estimator 106 controls the magnitude of each phase current because if the same voltage $|\hat{v}|_n$ is applied at each iteration step, the corresponding phase current magnitude $|\hat{\imath}|_n$ will drop significantly as $\omega_n$ (electrical frequency) increases. This would cause accuracy and precision issues when measuring the current magnitude due to ADC limitations, as previously explained herein.

Accordingly, the PMSM parameter estimator 106 controls the magnitude of each phase current injected into the PMSM 102 during each iteration of revising the estimate of the inductance parameter L, e.g., at 5% to 10% of the peak current rating of the PMSM 102 at each iteration step, while updating the inductance estimation. The PMSM parameter estimator 106 can achieve these goals by using the following iterative method which results in convergence of both $L_n$ to the real inductance value and current magnitude $|\hat{\imath}|_n$ to the commanded (target) current magnitude $|\hat{\imath}|^*$. The PMSM parameter estimator 106 iteratively revises the estimate of the inductance parameter L of the PMSM 102, until the estimate either converges to a predetermined accuracy level or diverges. For the nth iteration where n≥2, the PMSM parameter estimator 106 implements the following steps:

$$\begin{cases} n^{th} \text{ iteration} \\ n = 2, 3, \ldots \end{cases} : \begin{cases} \text{Step 1: } |\hat{z}|_{n-1}^2 = \frac{|\hat{v}|_{n-1}^2}{|\hat{\imath}|_{n-1}^2} \\ \text{Step 2: } a_{n-1} = a_{n-2} + \left(|\hat{z}|_{n-1}^2 - r^2\right)\omega_{n-1}^2 \\ \text{Step 3: } b_{n-1} = b_{n-2} + \omega_{n-1}^4 \\ \text{Step 4: } L_{n-1}^2 = \frac{a_{n-1}}{b_{n-1}} \\ \text{Step 5: } |\hat{v}|_n^2 = (|\hat{\imath}|^*)^2\left(r^2 + \omega_n^2 L_{n-1}^2\right) \end{cases} \tag{29}$$

For the nth iteration where n≥2, this involves the PMSM parameter estimator 106 estimating an impedance $\hat{z}$ of the PMSM 102 for an immediately preceding iteration n−1 of revising the estimate, estimating the inductance parameter L for the immediately preceding iteration n−1, and calculating a voltage $\hat{v}$ to be applied to the PMSM 102 during the present iteration n.

The PMSM parameter estimator 106 can estimate the impedance $\hat{z}$ of the PMSM 102 for iteration n−1 based on the voltage $\hat{v}$ applied to the PMSM 102 during iteration n−1 and a phase current $\hat{i}$ measured in response to the voltage $\hat{v}$ applied to the PMSM 102 during iteration n−1. The PMSM parameter estimator 106 can estimate the inductance parameter L for iteration n−1 based on the impedance $\hat{z}$ estimated for iteration n−1, a frequency $\omega$ at which the voltage was applied to the PMSM during iteration n−1, and a stator resistance estimate r for the PMSM 102.

According to equation (29), at each iteration step, the PMSM parameter estimator 106 first calculates the resulting impedance $\hat{z}$ of the previous iteration n−1 from the applied voltage $\hat{v}$ and the measured current $\hat{i}$ of the previous iteration n−1. Then, the PMSM parameter estimator 106 updates the numerator $a_{n-1}$ and denominator $b_{n-1}$ of the inductance estimation ratio and estimates the inductance value L of the previous iteration n−1. Then, the PMSM parameter estimator 106 calculates the required voltage $\hat{v}$ for the current iteration n that would result in the current command (target magnitude) $|\hat{i}|^*$ being satisfied in the current iteration n.

Regarding step 2 of equation (29), the PMSM parameter estimator 106 can calculate a numerator $a_{n-1}$ of an inductance estimation ratio $$\frac{a_{n-1}}{b_{n-1}}$$

for iteration n−1 based on the numerator $a_{n-2}$ calculated for iteration n−2, the impedance $\hat{z}$ estimated for iteration n−1, the frequency $\omega$ at which the voltage $\hat{v}$ was applied to the PMSM 102 during iteration n−1, and the stator resistance estimate r for the PMSM 102. The PMSM parameter estimator 106 can calculate the denominator $b_{n-1}$ of the inductance estimation ratio $$\frac{a_{n-1}}{b_{n-1}}$$

for iteration n−1 based on the denominator $b_{n-2}$ calculated iteration n−2 and the frequency $\omega$ at which the voltage $\hat{v}$ was applied to the PMSM 102 during iteration n−1. The PMSM parameter estimator 106 can then divide the numerator $a_{n-1}$ calculated for iteration n−1 by the denominator $b_{n-1}$ calculated for iteration n−1 to estimate the inductance parameter L for iteration n−1.

Regarding step 5 of equation (29), the PMSM parameter estimator 106 can calculate the voltage $\hat{v}$ to be applied to the PMSM 102 during the present iteration n based on a target current magnitude $|\hat{i}|^*$ (also referred to herein as current command or commanded current) for the PMSM 102, the stator resistance estimate r for the PMSM 102, the inductance parameter L estimated for the immediately preceding iteration n−1, and the frequency $\omega$ at which the voltage $\hat{v}$ is applied to the PMSM 102 during the present iteration n. In one embodiment, the target current magnitude $|\hat{i}|^*$ is a fixed percentage less than 100% of the peak current rating of the PMSM 102, such that each phase current injected into the PMSM 102 during each iteration of revising the estimate of the inductance parameter L does not exceed the fixed percentage of the peak current rating of the PMSM 102. For example, the fixed percentage may be in a range of 5% to 10% of the peak current rating of the PMSM 102.

The starting point of the iterative process implemented by the PMSM parameter estimator 106 can be as follows:

$$\left\{ \begin{matrix} 1^{th} \text{ iteration} \\ n=1 \end{matrix} \right. : \begin{cases} \text{Step 1: } |\hat{z}|_0^2 = 0 \\ \text{Step 2: } a_0 = 0 \\ \text{Step 3: } b_0 = 0 \\ \text{Step 4: } L_0^2 = 0 \\ \text{Step 5: } |\hat{v}|_1^2 = (|\hat{i}|^*)^2 (r^2) \end{cases} \tag{30}$$

As indicated by equation (30), the PMSM parameter estimator 106 can initially set the impedance estimate $\hat{z}$ for the PMSM 102 and the estimate of the inductance parameter L to zero (0). The PMSM parameter estimator 106 can also initially calculate the voltage $\hat{v}$ to be applied to the PMSM 102 based on the target current magnitude $|\hat{i}|^*$ for the PMSM 102 and the stator resistance estimate r for the PMSM 102.

The iterative sequence represented by equations (29) and (30) and implemented by the PMSM parameter estimator 106 results in convergence of the estimated inductance L to the actual inductance L, within a predetermined accuracy level, and convergence of the resulting currents $|\hat{i}|$ to the commanded (target) current $|\hat{i}|^*$ at the same time. Equations (29) and (30) implement a comparison test to test for convergence. However, this just one example. Other convergence tests may be used, e.g., such as a ratio test, a root test, etc. More generally, any accepted convergence test could be used to determine whether the estimated inductance L converges to the actual inductance L, within a predetermined accuracy level.

Figure 4:
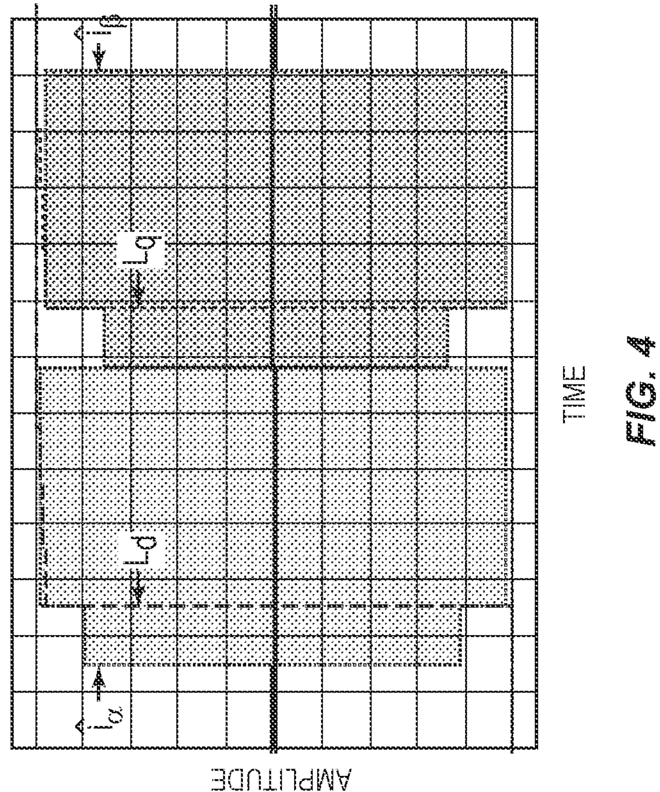
FIG. 4 illustrates simulation waveforms of current control and inductance estimates calculated using the iterative parameter estimation process.

FIG. 4 illustrates the iterative current control and inductance estimation for $L_d$ and $L_q$. As can be seen in FIG. 4, the inductance estimations $L_d$ and $L_q$ converge to their corresponding real values while the current magnitudes $\hat{i}_\alpha$, $\hat{i}_\beta$ converge to the commanded (target) current $|\hat{i}|^*$.

Figure 5:
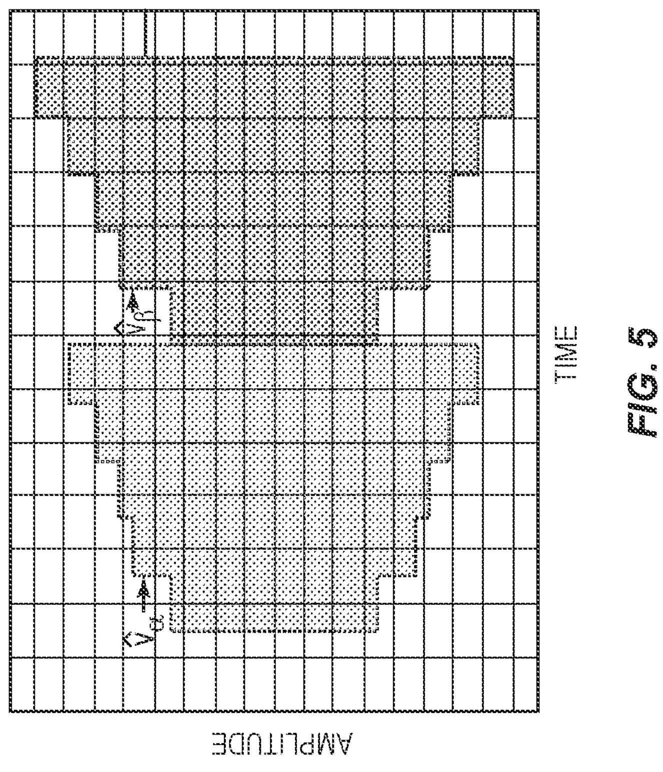
FIG. 5 illustrates simulation waveforms of high-frequency voltages calculated using the iterative parameter estimation process and applied to the motor to achieve constant current magnitudes at or near a commanded (target) current magnitude while simultaneously calculating the inductance estimates.

FIG. 5 illustrates the calculated high-frequency voltages $\hat{v}_\alpha$, $\hat{v}_\beta$ that are applied to the PMSM 102 to achieve constant current magnitudes at or near $|\hat{i}|^*$ while simultaneously calculating the inductance estimates $L_d$ and $L_q$. A divergence of the iterative sequence indicates that the final results are not reliable and should be discarded.

Equations (29) and (22) yield the following current and voltage relationships:

$$\begin{cases} |\hat{i}|_n^2 = \dfrac{|\hat{v}|_n^2}{r^2 + \omega_n^2 L^2} \\ |\hat{v}|_n^2 = (|\hat{i}|^*)^2 \left(r^2 + \omega_n^2 L_{n-1}^2\right) \end{cases} \tag{31}$$

Thus:

$$|\hat{i}|_n^2 = (|\hat{i}|^*)^2 \frac{r^2 + \omega_n^2 L_{n-1}^2}{r^2 + \omega_n^2 L^2} \tag{32}$$

As indicated by equation (32), when $L_n$ converges to L, $|\hat{i}|_n$ also converges to $|\hat{i}|^*$ and vice-versa, as follows:

$$\left\{L_n^2 = L_{n-1}^2 = \dots = L^2\right\} \Leftrightarrow \left\{|\hat{i}|_n^2 = |\hat{i}|_{n-1}^2 = \dots = (|\hat{i}|^*)^2\right\} \tag{33}$$

That is, the PMSM parameter estimator 106 controls the magnitude of the phase currents injected into the PMSM 102 during each iteration of revising the estimate of the inductance parameter L so that the phase currents converge to the target current magnitude $|\hat{i}|^*$ for the PMSM 102 as the estimate of the inductance parameter L converges towards the desired predetermined accuracy level, by adjusting the voltage $\hat{i}$ to be applied to the PMSM 102 during each iteration of revising the estimate of the inductance parameter L.

As shown in FIG. 3, the PMSM parameter estimator 106 may include PI (proportional-integral) controller parameters $k_p$ and $k_i$ that are chosen by considering the overall loop-gain of the $I_\alpha$ and $I_\beta$ current controllers, which also include $H_{i,1}(s)$ in their respective paths. Without loss of generality, $H_{i,1}(s)$ can be any low pass filter that provides enough attenuation for the high-frequency current components to prevent the high-frequency current components from entering the dc-current loops. For example, $H_{i,1}(s)$ can be implemented as follows:

$$H_{i,1}(s) = \left(\frac{\omega_{sep}}{s + \omega_{sep}}\right) \tag{34}$$

Similarly in FIG. 3, $H_v(s)$ and $H_{i,2}(s)$ can be any low pass filter with significant attenuation of high-frequency voltage or current components. For example, $H_v(s)$ and $H_{i,2}(s)$ can be m-order filters (m≥2) to provide −(20 m) dB/dec attenuation at high frequencies. For example, $H_v(s)$ and $H_{i,2}(s)$ can be implemented as follows:

$$H_{i,2}(s) = 2\left(\frac{\omega_{0,i}}{s + \omega_{0,i}}\right)^m \tag{35}$$

$$H_v(s) = \left(\frac{\omega_{0,v}}{s + \omega_{0,v}}\right)^m \tag{36}$$

In equation (35), there is a multiplication by a factor 2 in $H_{i,2}(s)$ to account for the demodulation gain (0.5) resulting from the $(\cdot)^2$ blocks in FIG. 3.

The PMSM parameter estimator 106 can support both IPM and SPM types. For IPM-type motors 102, the PMSM parameter estimator 106 can iteratively revise the estimate of the inductance parameter L of the PMSM 102 by iteratively revising an estimate of the inductance $L_d$ of the PMSM 102 along the d-axis which is aligned with the permanent magnet flux of the PMSM 102, and by iteratively revising an estimate of the inductance $L_q$ of the PMSM 102 along the q-axis which is perpendicular to the permanent magnet flux of the PMSM 102. For SPM-type motors 102, the PMSM parameter estimator 106 can iteratively revise the estimate of the inductance parameter L of the PMSM 102 by iteratively revising an estimate of the inductance $L_d$ of the PMSM 102 along the d-axis.

The controller 100 may also include a flux linkage estimator 116 for estimating the flux linkage of the PMSM 102. A motor with an imbedded magnet has a larger q-axis inductance than d-axis inductance. A motor with surface-mount magnets has nearly identical q-axis and d-axis inductances. The flux linkage estimator 116 estimates the flux linkage for either type of PMSM. The flux linkage estimation process may be implemented independently (separately) or in combination with the iterative parameter estimation process implemented by the PMSM parameter estimator 106.

Depending on whether the controller 100 uses RFO or SFO for FOC, the flux linkage estimator 116 can estimate the rotor flux linkage $\lambda_m$ as follows:

$$\begin{cases} RFO: \hat{\lambda}_m = \lambda_d^{r\prime} - (L_d - L_q) i_d^r \\ SFO: \hat{\lambda}_m = \lambda_d^s \cos(\hat{\delta}) + L_d\left(i_q^s \sin(\hat{\delta}) - i_d^s \cos(\hat{\delta})\right) \end{cases} \tag{37}$$

where $$\lambda_d^{r\prime}$$

is a magnitude component of a PLL (phase locked loop) of an observer 118 included in the controller 100 in RFO, $$\lambda_d^s$$

is the magnitude component of the observer PLL in SFO, and $\hat{\delta}$ is the estimated load angle in SFO.

The observer 118 includes one or more control loops designed to estimate or 'observe' internal variables of the system without directly measuring the variables. For example, a position observer estimates the rotor angular position without using an actual position sensor. A sensorless observer may also estimate motor speed without requiring a position sensor, and may be implemented together with FOC. A flux observer estimates stator flux without using a flux sensor.

For IPM SPMs, the flux linkage estimator 116 can estimate the rotor flux linkage $\lambda_m$ of the PMSM 102 based on a magnitude component $$\lambda_d^{r\prime}$$

of the PLL of the observer 118 used to implement RFO FOC of the PMSM 102, and a difference between the inductance $L_d$ estimated along the d-axis and the inductance $L_q$ estimated along the q-axis. For SFO FOC, the flux linkage estimator 116 can estimate the rotor flux linkage $\lambda_m$ of the PMSM 102 based on a magnitude component $$\lambda_d^s$$

of the PLL of the observer 118 used to implement SFO FOC of the PMSM 102, the inductance $L_d$ estimated along the d-axis, and an estimate $\hat{\delta}$ of the load angle δ in SFO. The load angle δ can be estimated by subtracting an estimate or of the rotor electrical angle from an estimate $\hat{\theta}_e$ of the stator electrical angle as follows:

$$\hat{\delta} = \hat{\theta}_e - \hat{\theta}_r \tag{38}$$

The inductance parameter L of the PMSM 102 used by the flux linkage estimator 116 to estimate the rotor flux linkage $\lambda_m$ of the PMSM 102 in either SFO or RFO FOC may be iteratively estimated by the PMSM parameter estimator 106 as previously described herein, or estimated by another method.

The motor control system may also include a computer program product that includes one or more non-transitory computer readable media 120 storing a computer program that is operable, when executed by the controller 100, to direct the controller 100 to execute the iterative parameter estimation process and/or the flux linkage estimation process described herein. Accordingly, the computer program includes program instructions to iteratively revise the estimate of the inductance parameter L of the PMSM 102, until the estimate either converges to a predetermined accuracy level or diverges, and program instructions to control the magnitude of phase currents injected into the PMSM 102 during each iteration of revising the estimate of the inductance parameter L. Separately or in combination, the computer program may include program instructions to estimate rotor flux linkage $\lambda_m$ of the PMSM 102 in accordance with equation (37) for RFO or SFO FOC.

Figure 7:
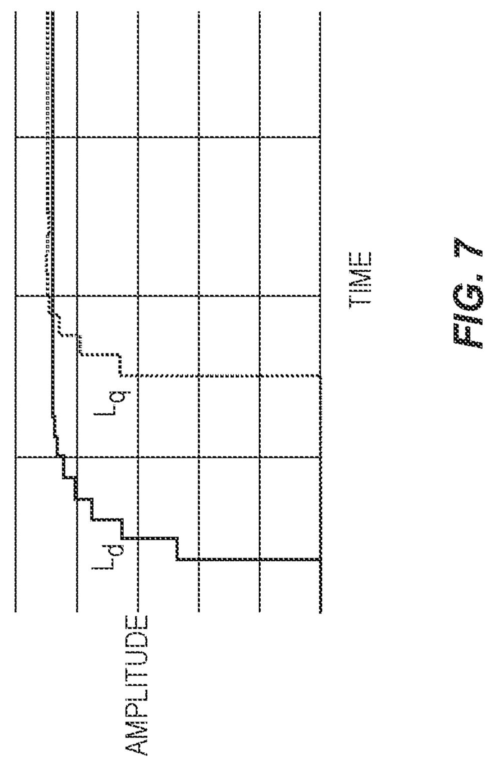
FIGS. 6 through 9 illustrate additional simulation and test bench results.
Figure 6:
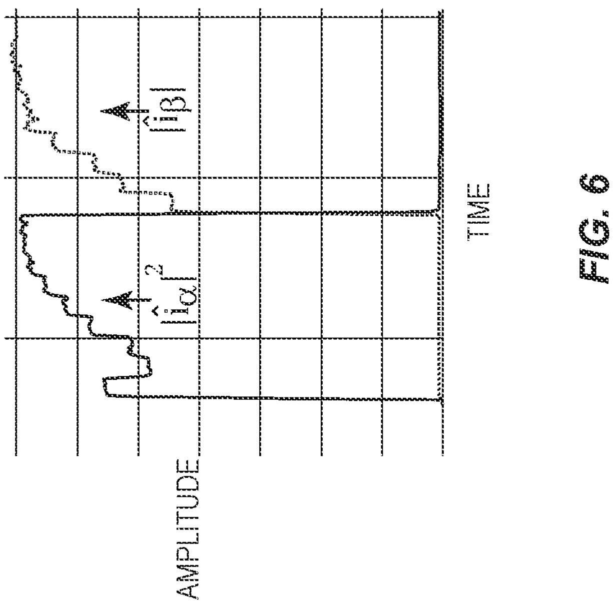
Figure 8:
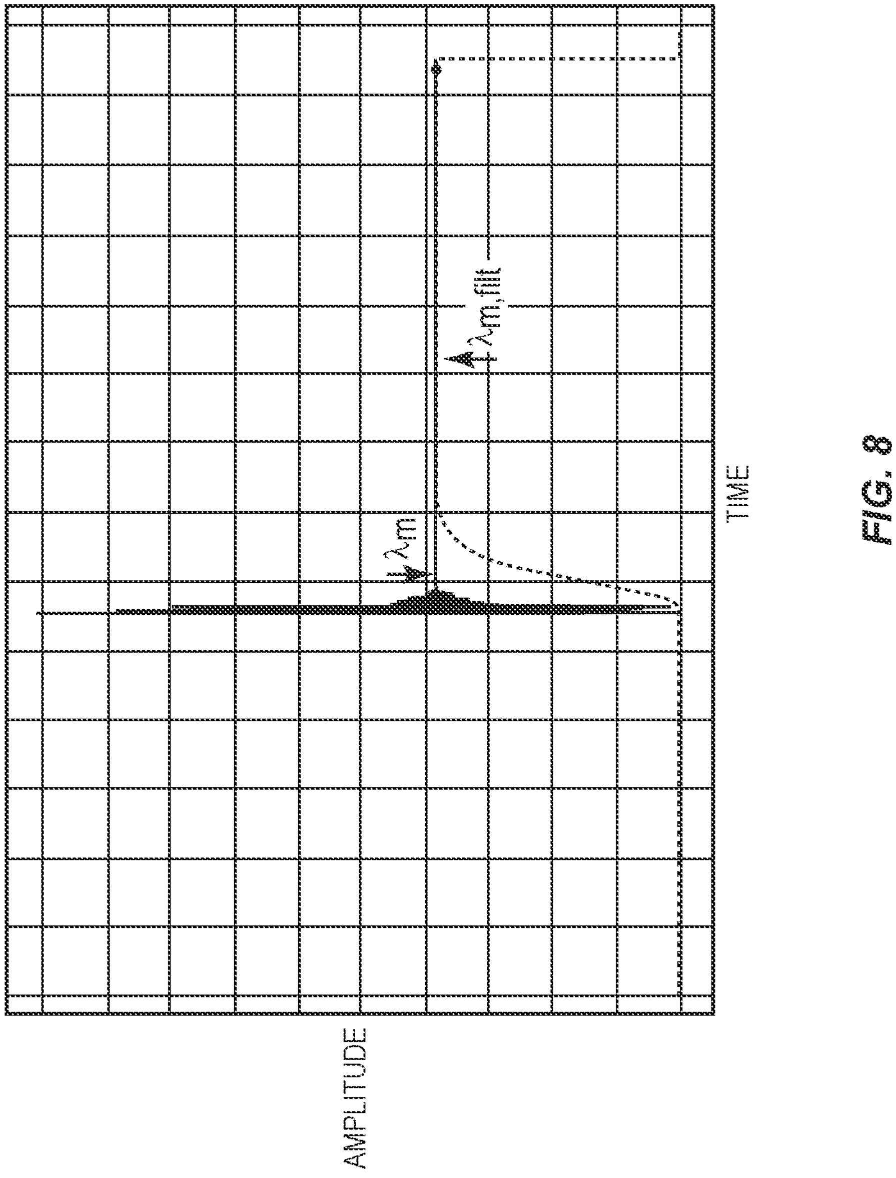
Figure 9:
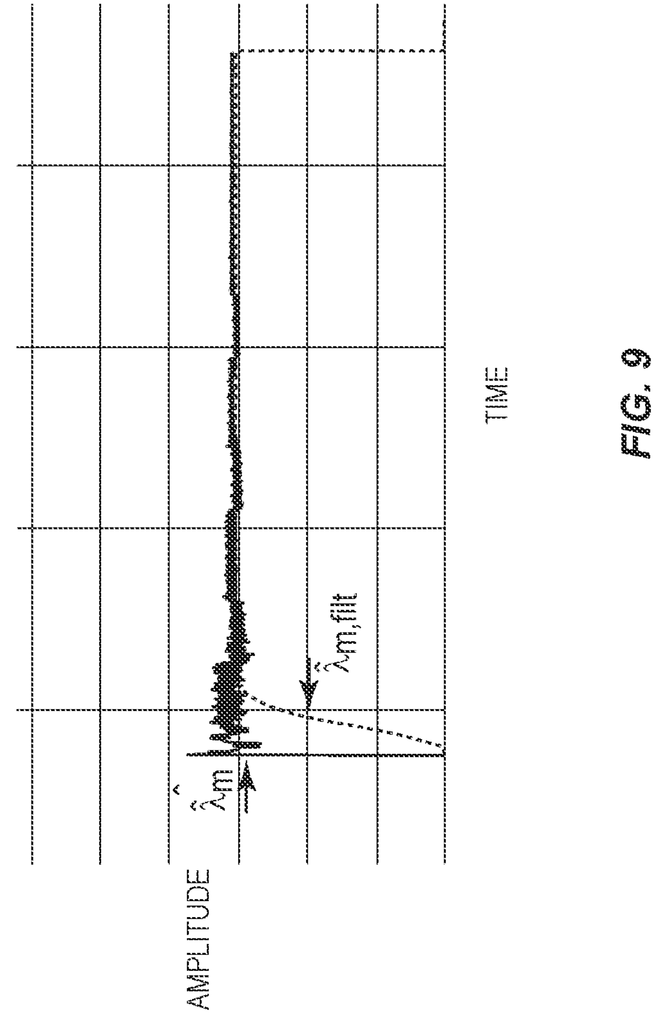

FIGS. 6 through 9 illustrate additional simulation and test bench results. FIG. 6 illustrates test bench results for the iterative current control during the inductance-measurement stage. FIG. 7 illustrates test bench results for the iterative inductance estimation process during the inductance-measurement stage. FIG. 8 illustrates simulation results for the flux linkage estimation stage, in closed-loop speed control mode. FIG. 9 illustrates test bench results for the flux linkage estimation stage, in closed-loop speed control mode.

Although the present disclosure is not so limited, the following numbered examples demonstrate one or more aspects of the disclosure.

Example 1. A method of parameter estimation for a PMSM (permanent magnet synchronous motor), the method comprising: iteratively revising an estimate of an inductance parameter of the PMSM, until the estimate either converges to a predetermined accuracy level or diverges; and controlling a magnitude of phase currents injected into the PMSM during each iteration of revising the estimate of the inductance parameter.

Example 2. The method of example 1, wherein during a present iteration of revising the estimate of the inductance parameter, the method comprises: estimating an impedance of the PMSM for an immediately preceding iteration of revising the estimate; estimating the inductance parameter for the immediately preceding iteration; and calculating a voltage to be applied to the PMSM during the present iteration.

Example 3. The method of example 2, wherein estimating the impedance of the PMSM for the immediately preceding iteration comprises: estimating the impedance of the PMSM based on a voltage applied to the PMSM during the immediately preceding iteration and a phase current measured in response to the voltage applied to the PMSM during the immediately preceding iteration.

Example 4. The method of example 2 or 3, wherein estimating the inductance parameter for the immediately preceding iteration comprises: estimating the inductance parameter based on the impedance estimated for the immediately preceding iteration, a frequency at which the voltage was applied to the PMSM during the immediately preceding iteration, and a stator resistance estimate for the PMSM.

Example 5. The method of example 4, wherein estimating the inductance parameter based on the impedance estimated for the immediately preceding iteration, the frequency at which the voltage was applied to the PMSM during the immediately preceding iteration, and the stator resistance estimate for the PMSM comprises: calculating a numerator of an inductance estimation ratio for the immediately preceding iteration, based on the numerator calculated two preceding iterations ago, the impedance estimated for the immediately preceding iteration, the frequency at which the voltage was applied to the PMSM during the immediately preceding iteration, and the stator resistance estimate for the PMSM; calculating a denominator of the inductance estimation ratio for the immediately preceding iteration, based on the denominator calculated two preceding iterations ago and the frequency at which the voltage was applied to the PMSM during the immediately preceding iteration; and dividing the numerator calculated for the immediately preceding iteration by the denominator calculated for the immediately preceding iteration.

Example 6. The method of any of examples 2 through 5, wherein calculating the voltage to be applied to the PMSM during the present iteration comprises: calculating the voltage based on a target current magnitude for the PMSM, a stator resistance estimate for the PMSM, the inductance parameter estimated for the immediately preceding iteration, and a frequency at which the voltage is applied to the PMSM during the present iteration.

Example 7. The method of example 6, wherein the target current magnitude is a fixed percentage less than 100% of a peak current rating of the PMSM, such that the phase currents injected into the PMSM during each iteration of revising the estimate of the inductance parameter do not exceed the fixed percentage of the peak current rating of the PMSM.

Example 8. The method of example 7, wherein the fixed percentage is in a range of 5% to 10% of the peak current rating of the PMSM.

Example 9. The method of any of examples 2 through 8, wherein the estimate of the impedance of the PMSM and the estimate of the inductance parameter are initially set to zero, and wherein the voltage to be applied to the PMSM is initially calculated based on a target current magnitude for the PMSM and a stator resistance estimate for the PMSM.

Example 10. The method of any of examples 1 through 9, wherein the magnitude of phase currents injected into the PMSM during each iteration of revising the estimate of the inductance parameter are controlled so as to converge to a target current magnitude for the PMSM as the estimate of the inductance parameter converges towards the predetermined accuracy level, by adjusting the voltage to be applied to the PMSM during each iteration of revising the estimate of the inductance parameter.

Example 11. The method of any of examples 1 through 10, wherein iteratively revising the estimate of the inductance parameter of the PMSM comprises: iteratively revising an estimate of an inductance of the PMSM along a first axis aligned with a permanent magnet flux of the PMSM; and iteratively revising an estimate of an inductance of the PMSM along a second axis perpendicular to the permanent magnet flux of the PMSM.

Example 12. The method of example 11, further comprising: estimating rotor flux linkage of the PMSM based on a magnitude component of a phase-lock-loop (PLL) used to implement rotor-frame-orientation (RFO) field oriented control (FOC) of the PMSM, and a difference between the inductance estimated along the first axis and the inductance estimated along the second axis.

Example 13. The method of any of examples 1 through 12, wherein iteratively revising the estimate of the inductance parameter of the PMSM comprises: iteratively revising an estimate of an inductance of the PMSM along an axis aligned with a permanent magnet flux of the PMSM.

Example 14. The method of example 13, further comprising: estimating rotor flux linkage of the PMSM based on a magnitude component of a phase-lock-loop (PLL) used to implement stator-frame-orientation (SFO) field oriented control (FOC) of the PMSM, the inductance estimated along the axis aligned with the permanent magnet flux of the PMSM, and a load angle estimate in SFO.

Example 15. A method of parameter estimation for a PMSM (permanent magnet synchronous motor), the method comprising: estimating of an inductance of the PMSM along a first axis aligned with a permanent magnet flux of the PMSM; estimating an inductance of the PMSM along a second axis perpendicular to the permanent magnet flux of the PMSM; and estimating rotor flux linkage of the PMSM based on a magnitude component of a phase-lock-loop (PLL) used to implement rotor-frame-orientation (RFO) field oriented control (FOC) of the PMSM, and a difference between the inductance estimated along the first axis and the inductance estimated along the second axis.

Example 16. A method of parameter estimation for a PMSM (permanent magnet synchronous motor), the method comprising: estimating of an inductance of the PMSM along an axis aligned with a permanent magnet flux of the PMSM; and estimating rotor flux linkage of the PMSM based on a magnitude component of a phase-lock-loop (PLL) used to implement stator-frame-orientation (SFO) field oriented control (FOC) of the PMSM, the inductance estimated along the axis aligned with the permanent magnet flux of the PMSM, and a load angle estimate in SFO.

Example 17. A computer program product comprising one or more non-transitory computer readable media storing a computer program operable, when executed by a controller, to direct the controller to execute a method of parameter estimation for a PMSM (permanent magnet synchronous motor), the computer program comprising: program instructions to iteratively revise an estimate of an inductance parameter of the PMSM, until the estimate either converges to a predetermined accuracy level or diverges; and program instructions to control a magnitude of phase currents injected into the PMSM during each iteration of revising the estimate of the inductance parameter.

Example 17. An executable program code comprising instructions which, when executed by a control circuit comprising a microcontroller, to cause the control circuit to carry out the method of any one of examples 1 to 16.

Terms such as “first”, “second”, and the like, are used to describe various elements, regions, sections, etc. and are also not intended to be limiting. Like terms refer to like elements throughout the description.

As used herein, the terms “having”, “containing”, “including”, “comprising” and the like are open ended terms that indicate the presence of stated elements or features, but do not preclude additional elements or features. The articles “a”, “an” and “the” are intended to include the plural as well as the singular, unless the context clearly indicates otherwise.

The expression “and/or” should be interpreted to include all possible conjunctive and disjunctive combinations, unless expressly noted otherwise. For example, the expression “A and/or B” should be interpreted to mean only A, only B, or both A and B. The expression “at least one of” should be interpreted in the same manner as “and/or”, unless expressly noted otherwise. For example, the expression “at least one of A and B” should be interpreted to mean only A, only B, or both A and B.

It is to be understood that the features of the various embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of parameter estimation for a PMSM (permanent magnet synchronous motor), the method comprising:

- iteratively revising an estimate of an inductance parameter of the PMSM, until the estimate either converges to a predetermined accuracy level or diverges;
- controlling a magnitude of phase currents injected into the PMSM during each iteration of revising the estimate of the inductance parameter;
- during a present iteration of revising the estimate of the inductance parameter:
  - estimating an impedance of the PMSM for an immediately preceding iteration of revising the estimate;
  - estimating the inductance parameter for the immediately preceding iteration; and
  - calculating a voltage to be applied to the PMSM during the present iteration.

2. The method of claim 1, wherein estimating the impedance of the PMSM for the immediately preceding iteration comprises:

- estimating the impedance of the PMSM based on a voltage applied to the PMSM during the immediately preceding iteration and a phase current measured in response to the voltage applied to the PMSM during the immediately preceding iteration.

3. The method of claim 1, wherein estimating the inductance parameter for the immediately preceding iteration comprises:

- estimating the inductance parameter based on the impedance estimated for the immediately preceding iteration, a frequency at which the voltage was applied to the PMSM during the immediately preceding iteration, and a stator resistance estimate for the PMSM.

4. The method of claim 3, wherein estimating the inductance parameter based on the impedance estimated for the immediately preceding iteration, the frequency at which the voltage was applied to the PMSM during the immediately preceding iteration, and the stator resistance estimate for the PMSM comprises:

- calculating a numerator of an inductance estimation ratio for the immediately preceding iteration, based on the numerator calculated two preceding iterations ago, the impedance estimated for the immediately preceding iteration, the frequency at which the voltage was applied to the PMSM during the immediately preceding iteration, and the stator resistance estimate for the PMSM;
- calculating a denominator of the inductance estimation ratio for the immediately preceding iteration, based on the denominator calculated two preceding iterations ago and the frequency at which the voltage was applied to the PMSM during the immediately preceding iteration; and
- dividing the numerator calculated for the immediately preceding iteration by the denominator calculated for the immediately preceding iteration.

5. The method of claim 1, wherein calculating the voltage to be applied to the PMSM during the present iteration comprises:

calculating the voltage based on a target current magnitude for the PMSM, a stator resistance estimate for the PMSM, the inductance parameter estimated for the immediately preceding iteration, and a frequency at which the voltage is applied to the PMSM during the present iteration.

6. The method of claim 5, wherein the target current magnitude is a fixed percentage less than 100% of a peak current rating of the PMSM, such that the phase currents injected into the PMSM during each iteration of revising the estimate of the inductance parameter do not exceed the fixed percentage of the peak current rating of the PMSM.

7. The method of claim 6, wherein the fixed percentage is in a range of 5% to 10% of the peak current rating of the PMSM.

8. The method of claim 1, wherein the estimate of the impedance of the PMSM and the estimate of the inductance parameter are initially set to zero, and wherein the voltage to be applied to the PMSM is initially calculated based on a target current magnitude for the PMSM and a stator resistance estimate for the PMSM.

9. The method of claim 1, wherein the magnitude of phase currents injected into the PMSM during each iteration of revising the estimate of the inductance parameter are controlled so as to converge to a target current magnitude for the PMSM as the estimate of the inductance parameter converges towards the predetermined accuracy level, by adjusting the voltage to be applied to the PMSM during each iteration of revising the estimate of the inductance parameter.

10. The method of claim 1, wherein iteratively revising the estimate of the inductance parameter of the PMSM comprises:

iteratively revising an estimate of an inductance of the PMSM along a first axis aligned with a permanent magnet flux of the PMSM; and iteratively revising an estimate of an inductance of the PMSM along a second axis perpendicular to the permanent magnet flux of the PMSM.

11. The method of claim 10, further comprising:

estimating rotor flux linkage of the PMSM based on a magnitude component of a phase-lock-loop (PLL) used to implement rotor-frame-orientation (RFO) field oriented control (FOC) of the PMSM, and a difference between the inductance estimated along the first axis and the inductance estimated along the second axis.

12. The method of claim 1, wherein iteratively revising the estimate of the inductance parameter of the PMSM comprises:

iteratively revising an estimate of an inductance of the PMSM along an axis aligned with a permanent magnet flux of the PMSM.

13. The method of claim 12, further comprising:

estimating rotor flux linkage of the PMSM based on a magnitude component of a phase-lock-loop (PLL) used to implement stator-frame-orientation (SFO) field oriented control (FOC) of the PMSM, the inductance estimated along the axis aligned with the permanent magnet flux of the PMSM, and a load angle estimate in SFO.

14. A method of parameter estimation for a PMSM (permanent magnet synchronous motor), the method comprising:

estimating an inductance of the PMSM along a first axis aligned with a permanent magnet flux of the PMSM;

estimating an inductance of the PMSM along a second axis perpendicular to the permanent magnet flux of the PMSM; and estimating rotor flux linkage of the PMSM based on a magnitude component of a phase-lock-loop (PLL) used to implement rotor-frame-orientation (RFO) field oriented control (FOC) of the PMSM, and a difference between the inductance estimated along the first axis and the inductance estimated along the second axis.

15. A method of parameter estimation for a PMSM (permanent magnet synchronous motor), the method comprising:

estimating an inductance of the PMSM along an axis aligned with a permanent magnet flux of the PMSM; and estimating rotor flux linkage of the PMSM based on a magnitude component of a phase-lock-loop (PLL) used to implement stator-frame-orientation (SFO) field oriented control (FOC) of the PMSM, the inductance estimated along the axis aligned with the permanent magnet flux of the PMSM, and a load angle estimate in SFO.

16. A computer program product comprising one or more non-transitory computer readable media storing a computer program operable, when executed by a controller, to direct the controller to execute a method of parameter estimation for a PMSM (permanent magnet synchronous motor), the computer program comprising: program instructions to iteratively revise an estimate of an inductance parameter of the PMSM, until the estimate either converges to a predetermined accuracy level or diverges; and program instructions to control a magnitude of phase currents injected into the PMSM during each iteration of revising the estimate of the inductance parameter; during a present iteration of revising the estimate of the inductance parameter: estimating an impedance of the PMSM for an immediately preceding iteration of revising the estimate; estimating the inductance parameter for the immediately preceding iteration; and calculating a voltage to be applied to the PMSM during the present iteration.

17. A method of parameter estimation for a PMSM (permanent magnet synchronous motor), the method comprising:

iteratively revising an estimate of an inductance parameter of the PMSM, until the estimate either converges to a predetermined accuracy level or diverges; and controlling a magnitude of phase currents injected into the PMSM during each iteration of revising the estimate of the inductance parameter, wherein the magnitude of phase currents injected into the PMSM during each iteration of revising the estimate of the inductance parameter are controlled so as to converge to a target current magnitude for the PMSM as the estimate of the inductance parameter converges towards the predetermined accuracy level, by adjusting the voltage to be applied to the PMSM during each iteration of revising the estimate of the inductance parameter.

* * * * *